(12) United States Patent
Kawamura et al.

(10) Patent No.: US 8,753,803 B2
(45) Date of Patent: Jun. 17, 2014

(54) PATTERN FORMING METHOD

(75) Inventors: Yoshihisa Kawamura, Kanagawa-ken (JP); Eishi Shiobara, Kanagawa-ken (JP); Shinichi Ito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 12/878,828

(22) Filed: Sep. 9, 2010

(65) Prior Publication Data

US 2011/0059406 A1 Mar. 10, 2011

(30) Foreign Application Priority Data

Sep. 10, 2009 (JP) ................ P2009-209086

(51) Int. Cl.
*G03F 7/20* (2006.01)

(52) U.S. Cl.
USPC ............ 430/323; 430/256; 264/319; 264/402

(58) Field of Classification Search
USPC .......................... 430/323, 256; 264/319, 402
See application file for complete search history.

(56) References Cited

U.S. PATENT DOCUMENTS

| | | | |
|---|---|---|---|
| 6,238,609 B1 * | 5/2001 | Stecker .................. | 264/246 |
| 7,281,919 B2 | 10/2007 | Shackleton et al. | |
| 2001/0040145 A1 * | 11/2001 | Willson et al. ................ | 216/52 |
| 2005/0214661 A1 | 9/2005 | Stasiak et al. | |
| 2006/0216853 A1 | 9/2006 | Nomoto | |
| 2006/0280829 A1 | 12/2006 | Kruijt-Stegeman et al. | |
| 2007/0138699 A1 | 6/2007 | Wuister et al. | |
| 2010/0044921 A1 | 2/2010 | Ito | |
| 2010/0109195 A1 * | 5/2010 | Xu et al. ....................... | 264/293 |
| 2010/0109205 A1 * | 5/2010 | Fletcher et al. ............... | 264/447 |
| 2010/0259821 A1 | 10/2010 | Kaida et al. | |
| 2011/0146568 A1 * | 6/2011 | Haukka et al. ................ | 118/200 |
| 2011/0200795 A1 * | 8/2011 | Lammers et al. .......... | 428/195.1 |

FOREIGN PATENT DOCUMENTS

| | | | |
|---|---|---|---|
| JP | 63-81639 | | 4/1988 |
| JP | 63-081639 | | 4/1988 |
| JP | 2-289311 | | 11/1990 |
| JP | 2002-204992 | * | 7/2002 |
| JP | 2005-349619 | | 12/2005 |
| JP | 2006-269599 | | 10/2006 |
| JP | 2006-352121 | | 12/2006 |
| JP | 2007-173806 | | 7/2007 |

(Continued)

OTHER PUBLICATIONS

Notification of Reasons for Refusal mailed Nov. 9, 2012, from the Japanese Patent Office in corresponding Japanese Pat. App. Pub. No. JP 2009-209086, and an English language translation of the Notification (8 pages total).

(Continued)

*Primary Examiner* — Kathleen Duda
*Assistant Examiner* — Caleen Sullivan
(74) *Attorney, Agent, or Firm* — Finnegan, Henderson, Farabow, Garrett & Dunner, L.L.P.

(57) ABSTRACT

According to one embodiment, a pattern forming method is disclosed. The method can include selectively providing a curing agent to a pattern in a template, contacting the template provided the curing agent to a substrate, irradiating the curing agent with light where the template and the substrate are contacted each other to harden the curing agent, demolding the template from the substrate to form a curing agent pattern on the substrate, and etching the substrate on a basis of the curing agent pattern.

16 Claims, 11 Drawing Sheets

(56) References Cited

FOREIGN PATENT DOCUMENTS

| | | |
|---|---|---|
| JP | 2008-260297 | 10/2008 |
| JP | 2008-263038 | 10/2008 |
| JP | 2009-88376 | 4/2009 |
| JP | 2009-184275 | 8/2009 |
| JP | 2009-190300 | 8/2009 |
| JP | 2009-208409 | 9/2009 |
| JP | 2010-076300 | 4/2010 |
| JP | 2010-284915 | 12/2010 |
| JP | 2010-284921 | 12/2010 |
| JP | 2011-025220 | 2/2011 |
| WO | WO 2009/041646 | 4/2009 |
| WO | WO 2009/041915 A1 | 4/2009 |
| WO | WO 2009/084392 | 7/2009 |

OTHER PUBLICATIONS

Notification of Reasons for Refusal issued by the Japanese Patent Office on Aug. 30, 2013, for Japanese Patent Application No. 2009-209086, and English-language translation.

Notification of Reasons for Refusal issued by the Japanese Patent Office on May 10, 2013, for Japanese Patent Application No. 2009-209086, and English-language translation.

* cited by examiner

— 1 —

PATTERN FORMING METHOD

CROSS REFERENCE TO RELATED APPLICATION

This application is based upon and claims the benefit of priority from prior Japanese Patent Application No. 2009-209086, filed on Sep. 10, 2009, the entire contents of which are incorporated herein by reference.

FIELD

Exemplary embodiments described herein relate to a pattern forming method which is used in fabricating of a semiconductor device, a hard disc, a photo array or the like.

BACKGROUND photo imprint lithography has been proposed as a method of forming the pattern in semiconductor device technology, record medium technology or the like.

First, a droplet of a photo-curing resin is disposed on a prescribed position of a substrate by an ink-jet method in imprint lithography. Next, the substrate is contacted to a quartz template via a resin, so that the photo-curing resin is filled in an unexcavated pattern on the quartz template.

The photo-curing resin is irradiated with light through the quartz template to harden the photo-curing resin. Successively, the quartz template is demolded from the substrate. Further, the residual film of the resin on the substrate is removed by etching or the like.

Finally, the substrate is etched to form a pattern therein on a basis of a resin pattern in which the residual film is removed.

Here, controlling of a discharge amount of the photo-curing resin is demanded as picoliter order for coating the photo-curing resin in the ink-jet method. The optimum distribution of the photo-curing resin to be discharged on the substrate corresponding to a pattern density is calculated from information of template pattern on the template to control the discharge distribution.

Filling with the photo-curing resin into the template pattern is proceeded by capillarity. In a process that the resin is filled into the template pattern, a gas hermetically sealed in the template, which means an atmosphere in the process, is diffused and dissolved into the photo-curing resin. In such a manner, the resin is completely filled into the template pattern.

However, amount of the photo-curing resin as a solvent is determined by the discharge distribution mentioned above.

Therefore, when the necessary resin amount is not disposed near the template pattern, defects by insufficiently filling mentioned above may be generated where the gas is completely dissolved in the photo-curing resin.

— 2 —

Figure 5:
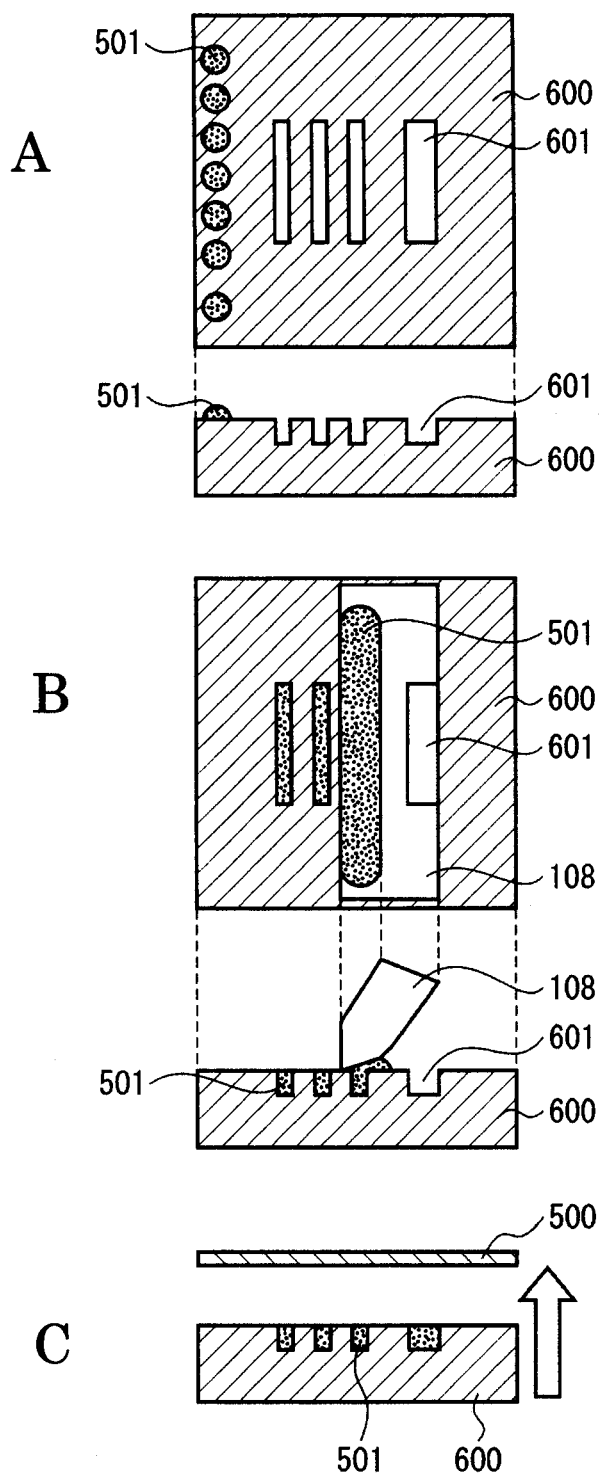
Figure 6:
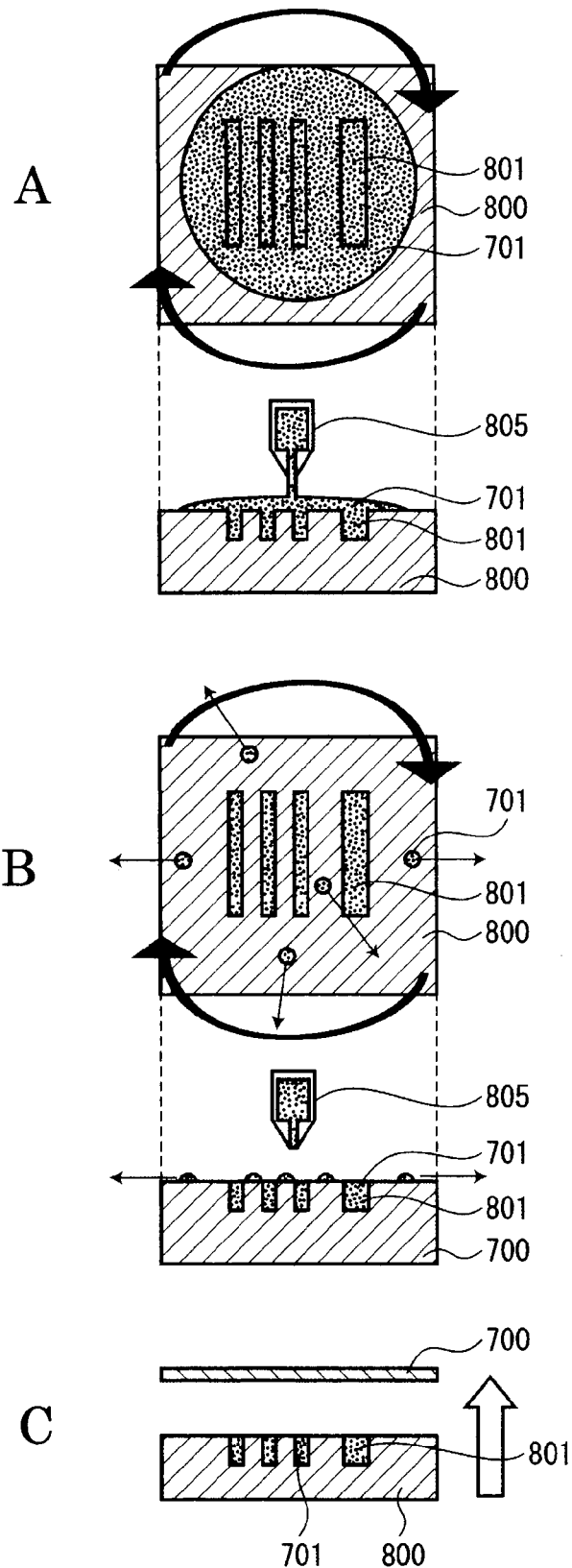
Figure 11:
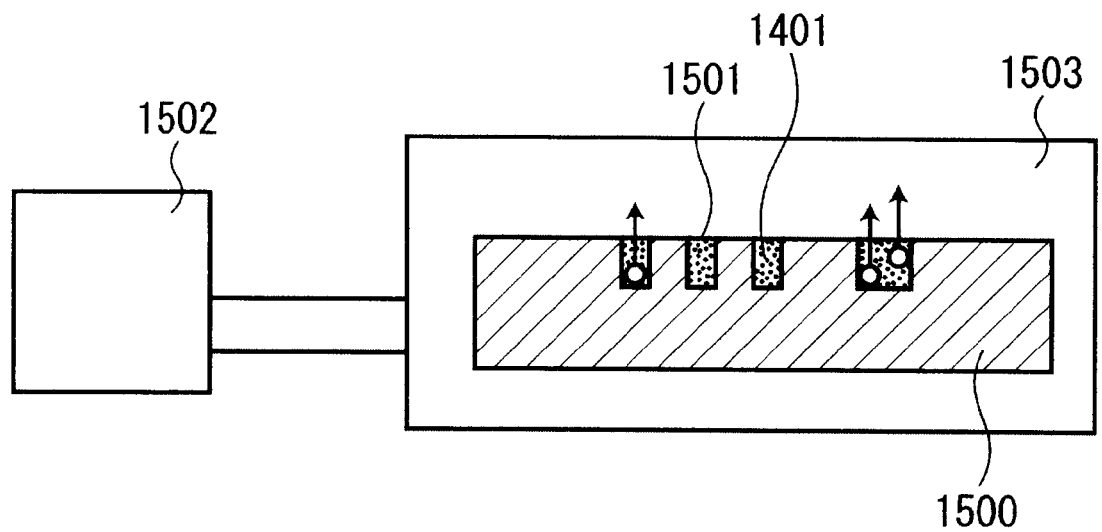
Figure 12:
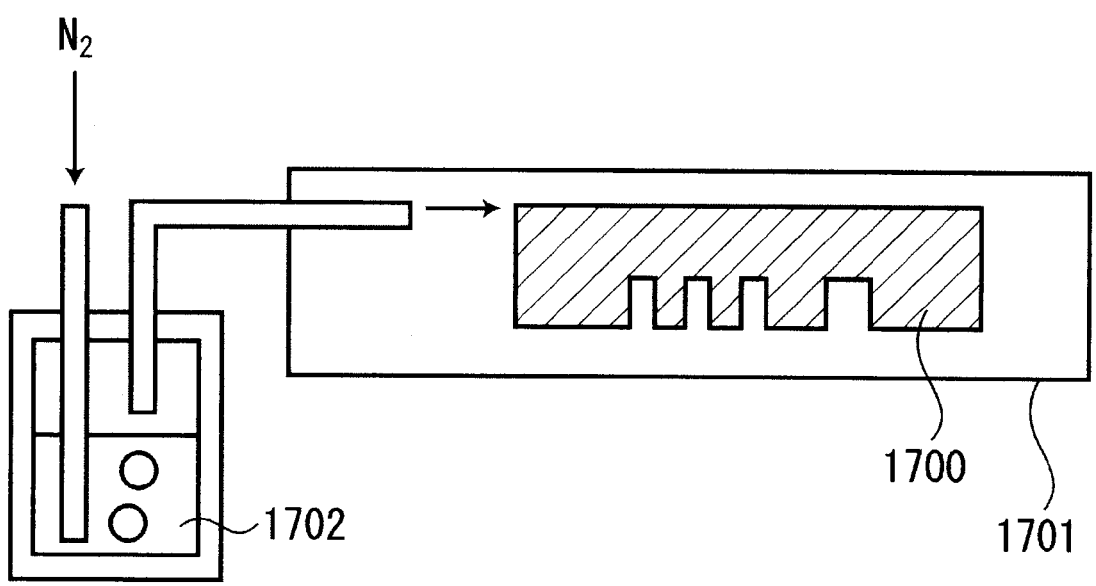

FIGS. 5A-5C are plane and cross-sectional views showing a method of forming the pattern according to the second embodiment;

FIGS. 6A-6C are plane and cross-sectional views showing a method of forming a pattern according to a third embodiment;

FIGS. 7A-7F are plane and cross-sectional views showing a method of forming a pattern according to a fourth embodiment;

FIGS. 8A-8F are plane and cross-sectional views showing the method of forming the pattern according to the fourth embodiment;

FIGS. 9A-9D are plane and cross-sectional views showing a method of forming a pattern according to a fifth embodiment;

FIGS. 10A-10D are plane and cross-sectional views showing the method of forming the pattern according to the fifth embodiment;

FIG. 11 is a cross-sectional view showing removing air bubbles in a method of forming a pattern according to a seventh embodiment;

FIG. 12 is across-sectional view showing providing water-repellent property to a template in a method of forming a pattern according to an eighth embodiment;

FIG. 13A-13B are cross-sectional views showing providing hydrophilic property on the template in a method of forming a pattern according to a ninth embodiment.

DETAILED DESCRIPTION

According to one embodiment, a pattern forming method is disclosed. The method can include selectively providing a curing agent to a pattern in a template, contacting the template provided the curing agent to a substrate, irradiating the curing agent with light where the template and the substrate are contacted each other to harden the curing agent, demolding the template from the substrate to form a curing agent pattern on the substrate, and etching the substrate on a basis of the curing agent pattern.

Embodiments will be described below in detail with reference to the attached drawings mentioned above. Throughout the attached drawings, similar or same reference numerals show similar, equivalent or same components.

(First Embodiment)

Figure 1:
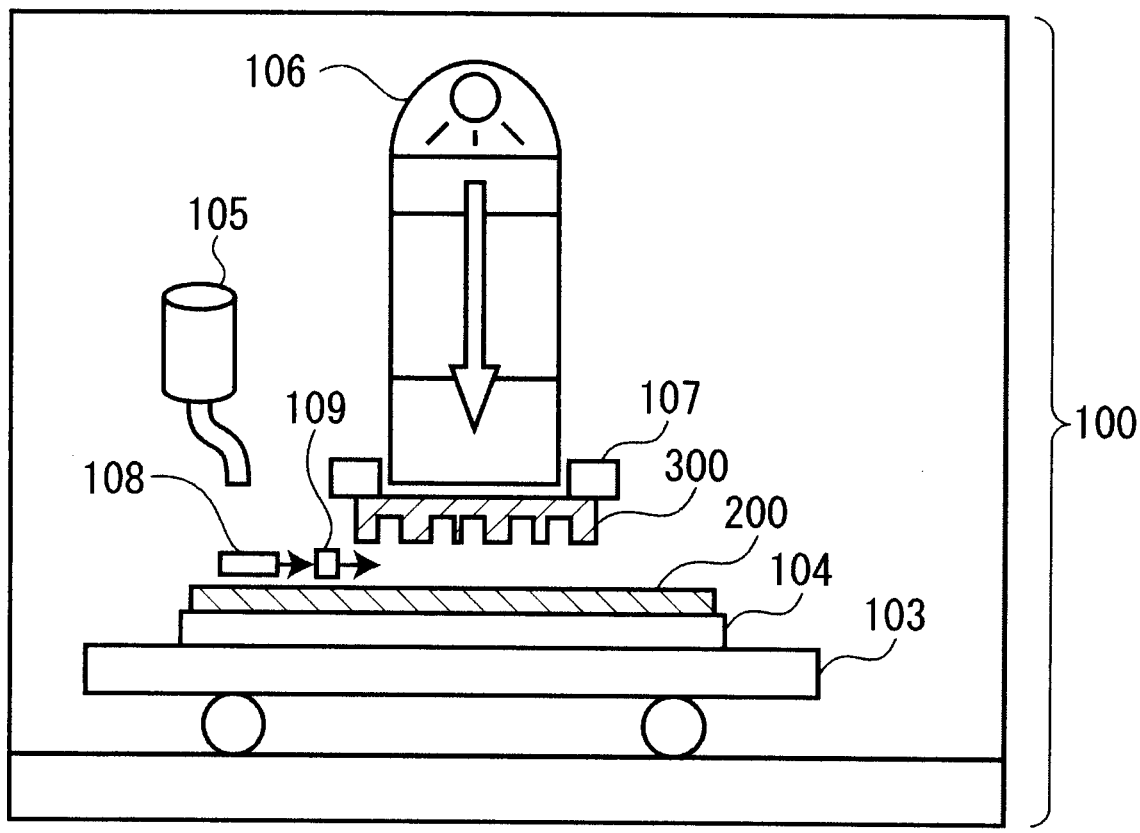
FIG. 1 is a perspective view showing imprint equipment for forming a pattern according to a first embodiment.

As reference to FIG. 1, imprint equipment for performing a photo imprint method according to a first embodiment is explained. FIG. 1 is a perspective view showing imprint equipment for forming a pattern according to a first embodiment.

As shown in FIG. 1, imprint equipment 100 includes a substrate chuck 104, a stage 103 for substrates, a coating portion 105 for curing agents, a template retaining portion 107 for templates, a slit nozzle 108, a light source 106, for example, a UV lump and a cleaning nozzle 109. The substrate chuck 104 fixes a substrate 200, a main surface of the substrate 200 being faced upward. The stage 103 three-dimensionally transports the substrate chuck 104. The coating portion 105 provides the curing agent in the slit nozzle 108. The template retaining portion 107 retains a concave pattern surface having a concave pattern in a template 300 for imprinting to be faced downward. The slit nozzle 108 contacts the curing agent to the concave pattern surface of the template 300 and relatively moves to the template concave pattern for filling the curing agent into the concave pattern of the template 300. The light source 106 irradiates light into the curing agent to harden the curing agent via the template 300. The cleaning nozzle 109 removes the curing agent leaved on the template 300. The template 300 is constituted with a transparent quartz substrate or the like in which the concave pattern is formed by plasma etching. Further, the substrate 200 and the template 300 are set in the equipment 100, when the equipment 100 as shown in FIG. 1 is used. Accordingly, the substrate 200 and the template 300 are not constituted with the equipment 100. Further, the cleaning nozzle 109 can be omitted.

As reference to FIGS. 2A-2F, the method of forming the pattern according to the first embodiment is explained. FIGS. 2A-2F are processing views showing the method of forming the pattern. Further, the upper views are plane views in the processes and the lower views are cross-sectional views in the processing steps, respectively, in FIG. 2A and FIG. 2B. Each plane view is corresponded to each cross-sectional view. FIGS. 2C-2F are cross-sectional views in the processing steps.

Figure 2:
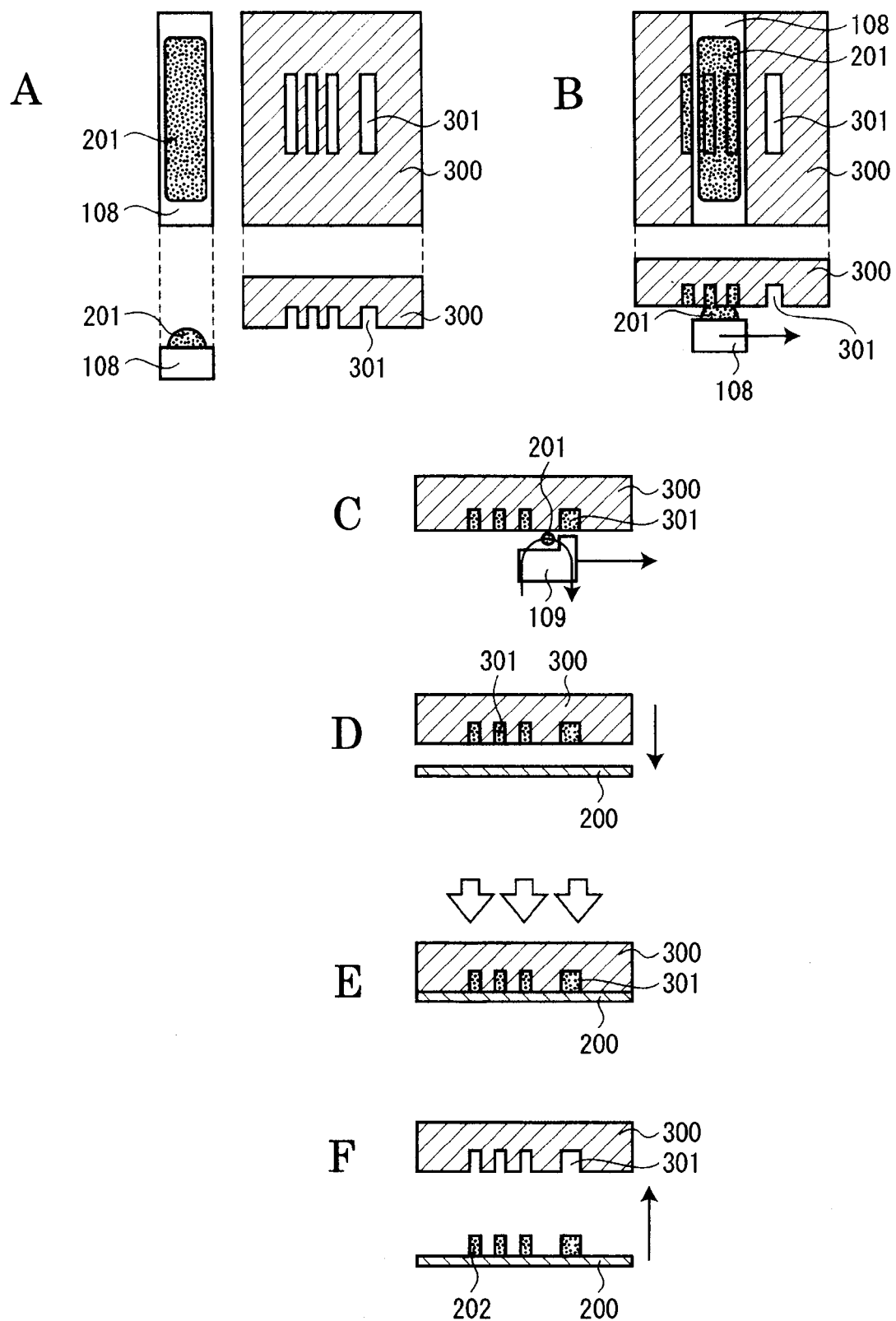
FIGS. 2A-2F are a plane and cross-sectional views showing a method of forming the pattern according to the first embodiment.

As shown in FIG. 2A, a curing agent 201 is provided from the coating portion 105 (not illustrated) to the slit nozzle 108 of the imprint equipment as shown in FIG. 1, so that a puddle of the curing agent 201 is formed. A surface having a pattern 301 of the template 300 is downwards to face the puddle of the curing agent 201 formed upper the slit nozzle 108. Here, a length, a width and a height of the puddle of the curing agent 201 set to be approximately 26 mm, 3 mm and 1 mm, respectively, and liquid amount is approximately 80 nl. The pattern 301 on the surface of the template 300 is formed in an area being 26 mm×33 mm. The liquid amount of the curing agent 201 being provided on the template 300 is set to be over a liquid amount which can completely dissolve a process atmosphere, namely inner atmosphere of the pattern 301, being as the same as a total volume of the template pattern 301 to be filled with the curing agent 201. For example, the puddle having the liquid amount over 21.45 nl is prepared, when the curing agent 201 with saturation amount of dissolution in the process atmosphere being 10 ml/l is applied to the template having a pattern opening ratio of 25% and a pattern depth of 100 nm.

As shown in FIG. 2A, the puddle of the curing agent 201 on the slit nozzle 108 is scanned to pattern area of the template 300 while continuing to be contacted to the pattern area of the template 300 in retaining parallel fashion between the slit nozzle 108 and the template 300. In this case, one of the slit nozzle 108 and the template 300 is shifted, or the both are shifted to relatively shift the slit nozzle 108 to the template 300. Here, a static contact angle of the curing agent 201 to the template 300 is 70° after being demolded.

When the puddle of the curing agent 201 and the template pattern 301 is contacted, the curing agent 201 is instantaneously penetrated into the pattern 301 by capillarity to completely fill the curing agent 201. When the process atmosphere is tentatively closed in the template pattern 301, the process atmosphere encapsulated by the puddle of the curing agent 201 is diffused into the curing agent 201 with a rate of nearly 100 μm/s to be dissolved. As a result, a defect due to incompletely filling with the curing agent 201 in the pattern 301 cannot be generated.

Figure 3:
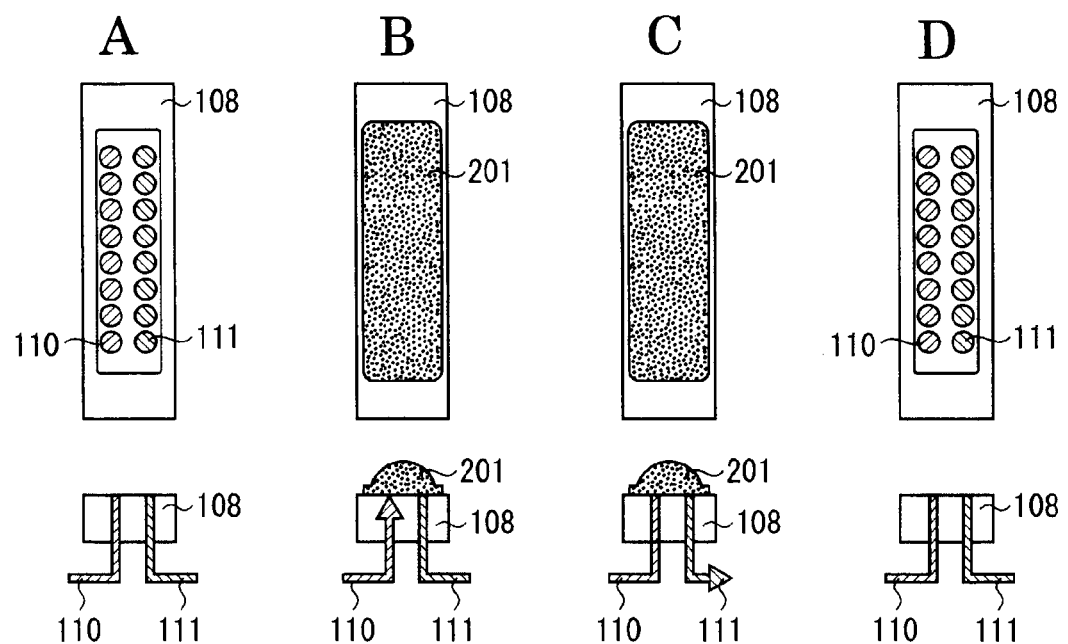
FIGS. 3A-3d are plane and cross-sectional views showing a slit nozzle being used in forming the pattern according to the first embodiment.

FIG. 3 shows the curing agent 201 formed in the slit nozzle 108 in scanning. The upper figures in FIGS. 3A-3d are plane views of the slit nozzle 108, the lower figures in FIGS. 3A-3d are cross-sectional views of the slit nozzle 108, respectively. A feeding line 110 and a discharging line 111 of the curing agent 201 are connected to a slit nozzle 108. As shown in FIG. 3A, the curing agent 201 is provided into the slit nozzle 108 from coating portion 105 for the curing agent (not illustrated) through the feeding line 110 before scanning. As shown in FIGS. 3B and 3C, the process atmosphere is dissolved into the curing agent 201 on the slit nozzle 108 in scanning. As shown in FIG. 3D, residual liquid of the curing agent 201 in the slit nozzle 108 is exhausted from the discharging line 111, after scanning is ended. As shown in FIG. 3A, the curing agent 201 is newly provided at next start of scanning. Consequently, the process atmosphere is constantly diffused and dissolved into the curing agent 201 in stably retaining soluble performance, so that generation of pattern defects is stably prevented.

When the unnecessary curing agent 201 is leaved a portion other than the template pattern 301, the cleaning nozzle 109 is scanned to a surface of the template 300, so that the unnecessary curing agent 201 can be leaved as shown in FIG. 2C. The cleaning nozzle 109 includes an outlet and an inlet of $N_2$ gas. $N_2$ gas is blown to the unnecessary curing agent 201 from the outlet, and the curing agent 201 and $N_2$ gas are inhaled from the inlet in scanning, so that the residual curing agent 201 can be removed. Further, cleaning by the cleaning nozzle 109 can be omitted when the unnecessary curing agent 201 is not residue.

Successively, the curing agent 201 is filled in the template pattern 301, the template 300 are gradually approached to the substrate 200 to contact and adhere the substrate 200 in retaining parallel fashion between the template 300 and the surface of the substrate 200 as shown in FIG. 2D.

As shown in FIG. 2E, UV light is irradiated into the curing agent 201 through the template 300 to harden the curing agent 201.

Finally, the template 300 is demolded from the substrate 200 to form a curing agent pattern 202 as shown in FIG. 2F.

After forming the curing agent pattern, the substrate 200 can be etched to form patterns in the substrate 200 by using the curing agent pattern as a mask.

Selectively providing the curing agent to the pattern 301 of the template 300 prevents the curing agent 201 from incompletely filling, so that the defects of the curing agent pattern 202 can be decreased according to the method of forming the pattern in this embodiment.

Further, the pattern surface of the template 300 is held vertically downward, so that the puddle of the curing agent 201 is provided vertically upward to the slit nozzle 108 according to the layout in the method of forming the pattern in this embodiment. However, the pattern surface of the template 300 can be held vertically upward, so that the puddle of the curing agent 201 can be provided vertically downward to the slit nozzle 108 as the layout. In this case, the template retaining portion 107 retains the template 300 in which the pattern surface of the template set to be upward in the constitution of the equipment 100.

(Second Embodiment)

Figure 4:
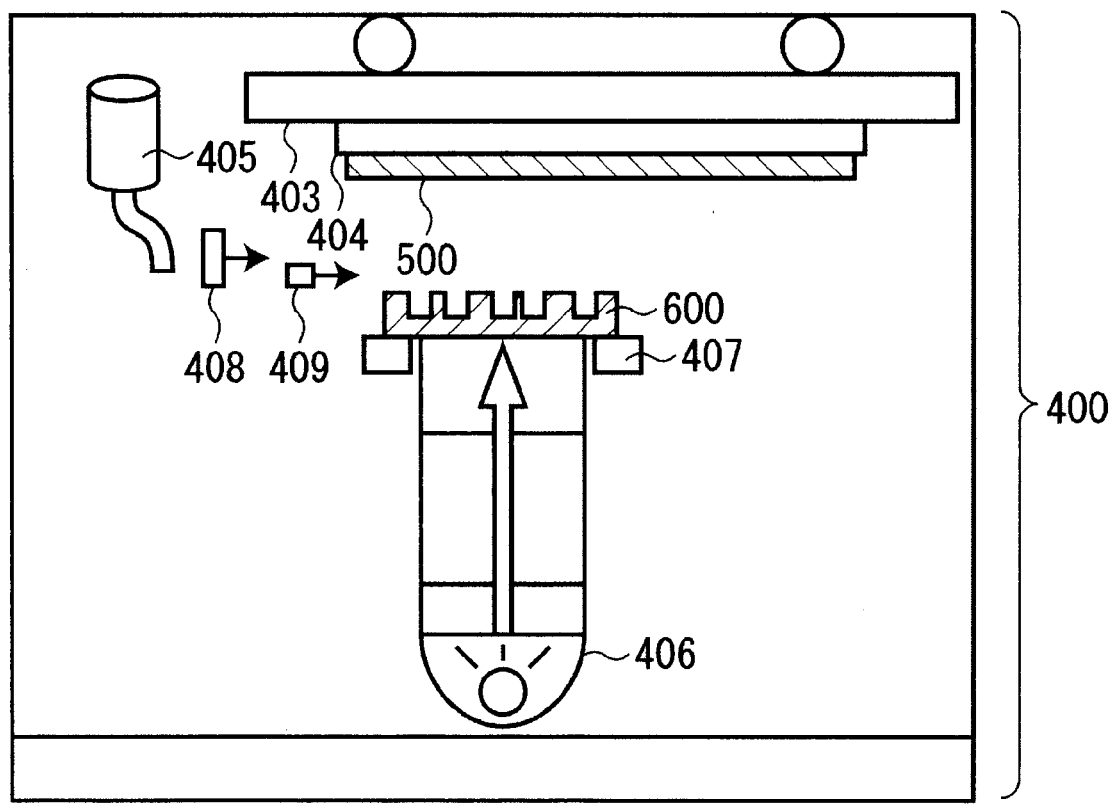
FIG. 4 is a perspective view showing imprint equipment for forming a pattern according to a second embodiment.

As reference to FIG. 4, imprint equipment for performing a photo imprint method according to a second embodiment is explained. FIG. 4 is a perspective view showing imprint equipment for forming a pattern.

Figure 10:
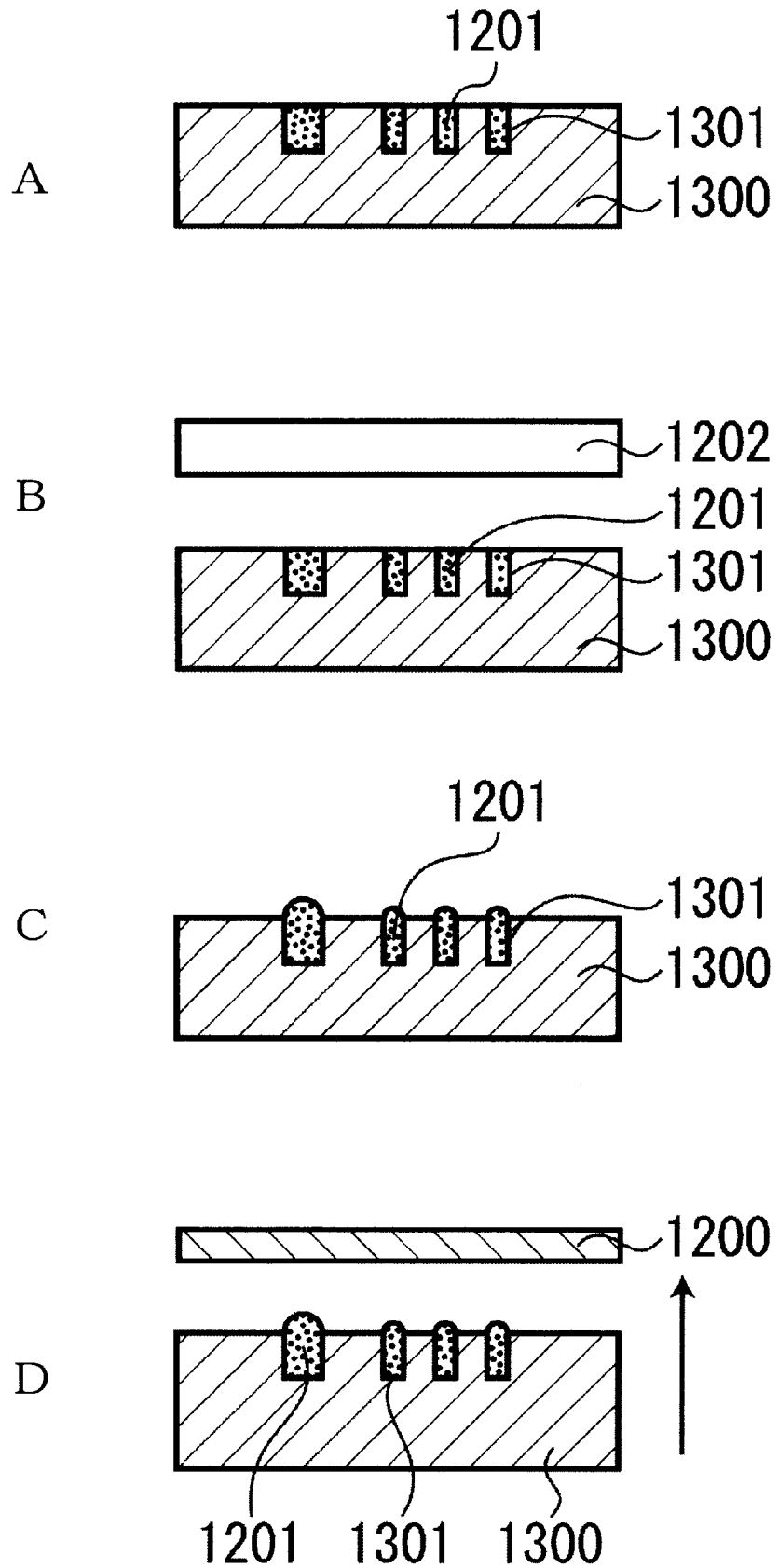

As shown in FIG. 4, imprint equipment 400 includes a substrate chuck 404, a stage 403 for substrates, a coating portion 405 for curing agents, a template retaining portion 407, a squeegee 408, a light source 406 and a cleaning nozzle 409. The substrate chuck 404 fixes a substrate 500, a main surface of the substrate 500 being faced downward. The stage 403 for the substrate three-dimensionally moves the substrate chuck 404 in which the substrate 500 is fixed. The coating portion 405 selectively provides a curing agent material to a concavo-convex pattern in the template 600. The template retaining portion 407 retains a concave pattern surface of the template 600 for imprinting to be faced upward. The squeegee 408 fills the curing agent which is coated into the pattern on the template 600. The light source 406, UV lump or the like, for example, is irradiated with light via the template to harden the curing agent. The cleaning nozzle 409 removes unnecessary curing agent. The template 600 for imprint is a transparent quartz substrate with a concavo-convex pattern formed by plasma etching or the like. Further, the substrate 500 and the template 600 are set to be in the equipment 400 as shown in FIG. 10 when using the equipment 400, therefore, the substrate 500 and the template 600 are not included in the equipment 400. The cleaning nozzle 409 can be omitted. The imprint equipment 400 is different from the imprint equipment as shown in FIG. 1 in following points. First, the substrate 500 is set that the main surface of the substrate 500 is faced downward. Secondly, the squeegee 408 is installed instead of the slit nozzle 108.

Successively, forming the pattern by the imprint method according to the second embodiment is explained as reference to FIGS. 5A-5C. FIGS. 5A-5C are plane and cross-sectional views showing the method of forming the pattern by. Further, the upper views are plane views in the processing steps and the lower views are cross-sectional views in the processing steps, respectively, in FIG. 5A and FIG. 5B. Each plane view is corresponded to each cross-sectional view. FIG. 5C is a cross-sectional view in the processing steps.

As shown in FIG. 5A, a curing agent 501 is discharged from the coating portion 405 for curing agents (not shown) to a pattern in an adjacent portion which is out of an area formed an engraved pattern 601 of a template 600 to arrange curing agent droplets 501 in a linear fashion. Here, amount of the droplets 501 is set to be 500 nl/dot, a number of the droplets is 7 dots, and dropping pitches are set to be 4.3 mm. Total amount of the droplets of the photo-curing resin 501 is set to be 3.5 ul.

The surface of the engraved pattern 601 of the template 600 is formed in an area of 26 mm×33 mm. The total liquid amount of the droplets of curing agent 501 provided on the template 600 is set to be over the total volume of the engraved pattern 601 formed in the template 600.

As shown in FIG. 5B, droplet 501 is relatively moved along the surface of template 600 by the squeegee 408. Immediately after starting the shift, droplets 501 are bonded each other to form a puddle 501 in a slit fashion. The puddle 501 is relatively shifted in continuing to contact the template 600 to the template 600 by the squeegee 408. When an engraved pattern region of the template 600 is scanned, the curing agent 501 instantaneously penetrates into the pattern 601 by capillarity to be completely filled. After scanning, the residual puddle 501 in the slit fashion is completely removed from the surface of the template by a recovery portion installed in the equipment 400. Further, the residual droplet 501 can be removed by scanning the cleaning nozzle 409 as same as the first embodiment.

As shown in FIG. 5C, the template 600 and the substrate 500 is gradually approached each other in retaining parallel fashion to contact the two surface, so that the template 600 and the substrate 500 are closely connected.

Subsequently, as same as the processing steps shown in FIGS. 2E and 2F, light is irradiated with the curing agent 501 via the template 600 to harden the curing agent 501. The template 600 is demolded from the substrate 500, so that a curing agent pattern is formed on the substrate 500. Further, the substrate 500 is etched using the curing agent pattern as a mask to form the pattern in the substrate 500.

In such a manner, selectively providing the curing agent 501 to the pattern 601 of the template 600 prevents the curing agent 501 from incompletely filling, so that defects in the curing agent pattern 202 can be decreased according to the method of forming the pattern in this embodiment.

(Third Embodiment)

As reference to FIGS. 6A-6C, imprint equipment for forming a pattern by an imprint method according to a third embodiment is explained. FIGS. 6A-6C are plane and cross-sectional views showing the method of forming the pattern. Further, the upper views are plane views in the processing steps and the lower views are cross-sectional views in the processing steps, respectively, in FIG. 6A and FIG. 6B. Each plane view is corresponded to each cross-sectional view. FIG. 6C is a cross-sectional view in the processes.

Further, the imprint equipment for an imprint method according to the third embodiment is the same as the imprint equipment as shown in FIG. 4. Accordingly, the figure is omitted. However, the imprint equipment in the third embodiment is different from FIG. 4 in following points. The template retaining portion 407 for template is constituted to be able to rotate the template and a squeegee is not installed.

As shown in FIG. 6A, a curing agent 701 is discharged near center of a region formed an engraved pattern 801 on the surface of the template 800 from a coating portion (coating nozzle) 805 for curing agents in continuing to rotate the template 800 to rotationally coat the curing agent 701. The curing agent solution 701 is contacted to the template 800 and relatively shifts from a coating point to circumference direction of the template 800. When the curing agent solution 701 passes the region of the engraved pattern 801 in template 800, the curing agent solution 701 instantaneously penetrates into the pattern 801 by capillarity to be completed for filling.

As shown in FIG. 6B, after stopping supply of the curing agent solution 701 from the coating nozzle 805, rotation of the template 800 is continued to completely shift the curing agent solution 701 attached other than the engraved pattern 801 from the template 800. In the manner, the curing agent solution 701 leaved on the surface of the template 800 further shifts to the circumference direction of the template 800 by centrifugal force due to the rotation. Subsequently, the rotation of the template 800 is stopped.

As shown in FIG. 6C, the template 800 and the substrate 700 is gradually approached each other in retaining parallel fashion to contact the two surface, so that the template 800 and the substrate 700 is closely connected.

Subsequently, as same as the processing steps shown in FIGS. 2E and 2F, light is irradiated to the curing agent 701 via the template 800 to photo-harden the curing agent 701. The template 800 is demolded from the substrate 700, so that a curing agent pattern is formed on the substrate 700. Further, the substrate 700 is etched using the curing agent pattern as a mask to form the pattern in the substrate 700.

The curing agent 501 having necessary amount to dissolve the processing atmosphere in the template pattern 801 can be coated on the template by using rotation coating in the method of forming the pattern according to this embodiment. In such a manner, selectively providing the curing agent 501 to the pattern 801 of the template 800 prevents the curing agent 501 from incompletely filling, so that defects in the curing agent pattern 202 can be decreased according to the method of forming the pattern in this embodiment.

(Fourth Embodiment)

As reference to FIGS. 7A-7E and FIGS. 8A-8E, a method of forming the pattern by an imprint method according to a fourth embodiment is explained. FIGS. 7A-7E and FIGS. 8A-8E are cross-sectional views showing the method of forming the pattern on a substrate. FIGS. 7A-7E show the method of forming the pattern in which a pattern surface of a template is faced downward and the substrate is faced upward. On the other hand, FIGS. 8A-8E show the method of forming the pattern in which the pattern surface of the template is faced upward and the substrate is faced downward.

Figure 7:
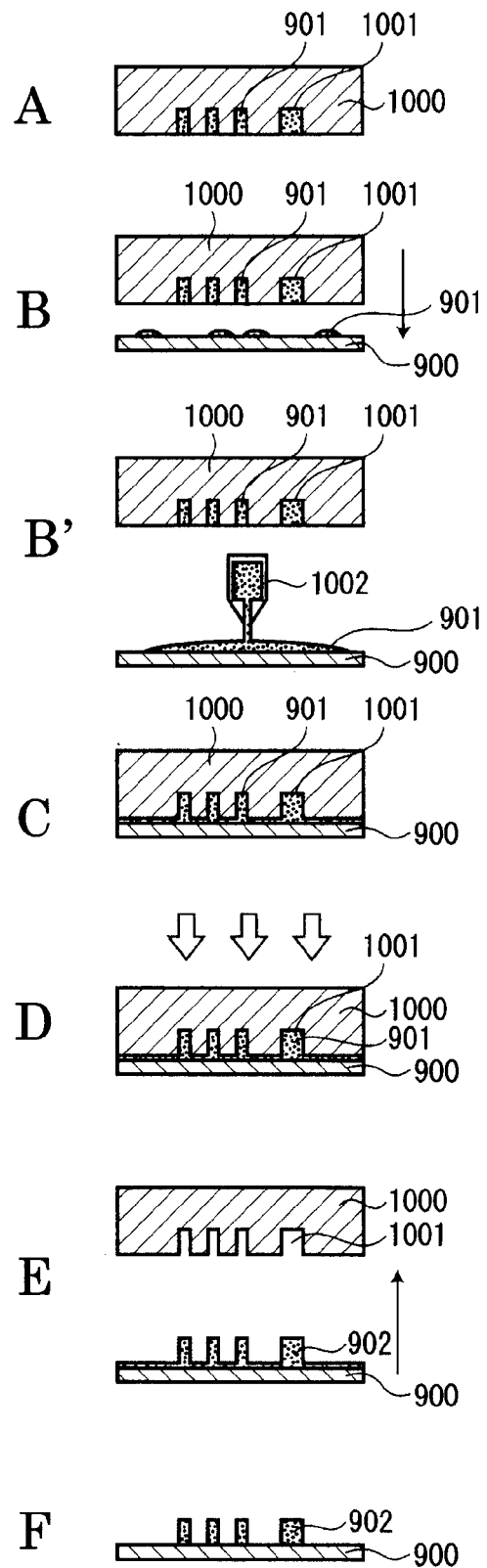
Figure 8:
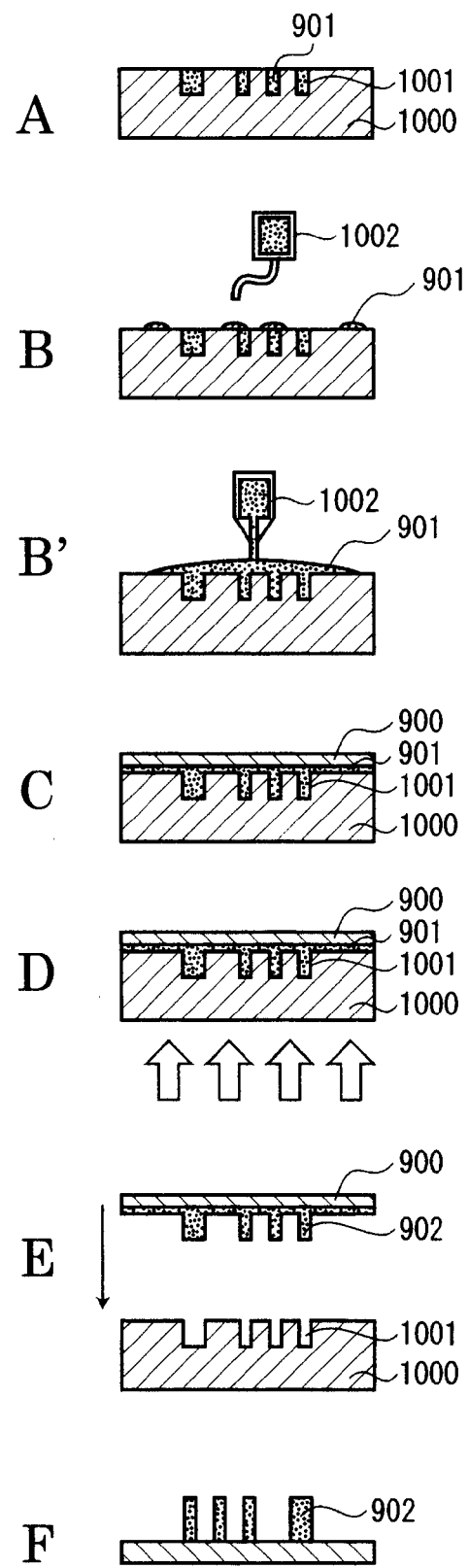

As shown in FIGS. 7A and 8A, a curing agent 901 is filled in a pattern 1001 formed in a template 1000. As the method of filling, at least one of the methods explained in the first, the second and the third embodiments, such as the slit nozzle, the squeegee and the rotation coating can be used. As shown in FIG. 7A, a pattern surface of the template 1000 is faced downwards and the substrate 900 is faced upward in the method of filling the curing agent 901 using the slit nozzle. On the other hand, the pattern surface of the template 1000 is faced upward and the substrate 900 is faced to be downward in the method of filling the curing agent 901 using the squeegee or the rotation coating as shown in FIG. 7A.

When the pattern surface of the template 1000 is faced downward, the curing agent 901 is fallen in drops on the substrate 900 retained under the template 1000 in an optimum distribution by ink-jet method as shown in FIG. 7B. As another case, a curing agent 901 in a film fashion may be formed on the substrate 900 from a nozzle 1002 by rotationally coating as shown in FIG. 7B'. Further, forming the curing agent 901 on the substrate 900 may be performed before filling the curing agent into the pattern of the template 1000.

On the other hand, when the pattern surface of the template 1000 is faced upward as shown in FIG. 8B, the curing agent 901 is fallen in drops on the pattern surface of the template 1000 in an optimum distribution by ink-jet method. As another case, as shown in FIG. 8B', the curing agent 901 in a film fashion may be formed on the substrate 900 from the nozzle 1002 by rotationally coating. As a result, the curing agent 901 is formed on a surface portion of the template 1000 out of the pattern.

As the curing agent 901 is filled in the engraved pattern 1001, a dripping distribution of the curing agent 901 is not dependent on the engraved pattern such as a feature, a size, a depth, a density or the like of the template 1000 in the processing steps. A total amount of the drips is controlled, so that the residual film (RLT) of the curing agent 901 generated in the contacting step between the template 1000 and the substrate 900 becomes the desired film thickness. For example, the total amount of the drips is set to be approximately 13 nl, when the desirable RLT thickness is 15 nm.

As shown in FIGS. 7C and 8C, the substrate 900 and the template 1000 are relatively shifted to closely contact the surfaces of the substrate 900 and the template 1000 via the curing agent 901. In the processing steps, a summit portion of the curing agent 901 or the template 1000 formed on the surface of the substrate 900 is firstly contacted to the template. Capillary force by capillarity simultaneously acts in the contacting step to spread the curing agent 901 along a space formed between the surfaces of the substrate 900 and the template 1000, so that the substrate 900 and the template 1000 are closely contacted in automatic fashion. In the processing steps, the RLT of the curing agent 901 is formed at the interface between the substrate 900 and the template 1000.

Subsequently, light is irradiated to the curing agent 901 via the template 1000 to harden the curing agent 901 as shown in FIGS. 7D and 8D.

Furthermore, the template 1000 is demolded from the substrate 200, so that the curing agent pattern is formed on the substrate 200 as shown in FIGS. 7E and 8E.

After the residual film of the curing agent pattern 902 is etched to be removed from the substrate 900, a pattern on the substrate 900 is formed using the curing agent pattern as a mask pattern as shown in FIGS. 7F and 8F.

In such a manner, incompletely filling the curing agent 501 into the pattern 1001 of the template 1000 can be prevented as the same as the previous embodiments mentioned above, so that defects in the curing agent pattern can be decreased according to the method of forming the pattern in this embodiment.

(Fifth Embodiment)

As reference to FIGS. 9A-9D and FIGS. 10A-10D, a method of forming a pattern by an imprint method according to a fifth embodiment is explained. FIGS. 9A-9D and FIGS. 10A-10D are cross-sectional views showing the method of forming the pattern on a substrate. FIGS. 9A-9D show a method of forming the pattern in which a pattern surface of a template is faced downward and the substrate is faced upward. On the other hand, FIGS. 10A-10D show a method of forming the pattern in which the pattern surface of the template is faced upward and the substrate is faced downward.

Figure 9:
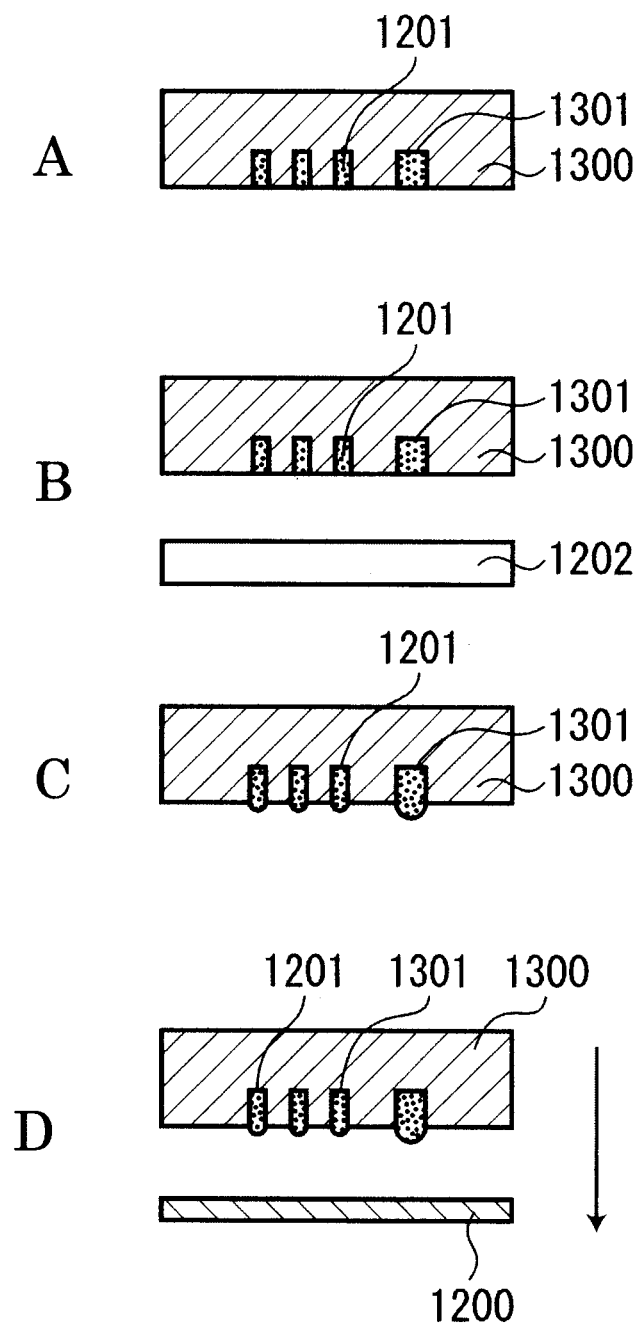

As shown in FIGS. 9A and 10A, a curing agent 1201 is filled in a pattern 1301 formed in a template 1300. As a method for filling, at least one of the methods explained in the first, the second and the third embodiments, such as the slit nozzle, the squeegee and the rotation coating, can be used. As shown in FIG. 9A, a pattern surface of the template 1300 is faced downward and the substrate 1200 is faced upward in the method of filling the curing agent 1201 using the slit nozzle. On the other hand, as shown in FIG. 10A, the pattern surface of the template 1300 is faced upward and the substrate 1200 is faced downward in the method of filling the curing agent 1201 using the squeegee or the rotation coating. A liquid amount of the curing agent 1201 is set to be over a liquid amount in which a process atmosphere is completely dissolved as the same volume as a total volume of the engraved pattern 1301 formed in the template 1300. Further, an excess curing agent 1201 generated after filling is removed as the same as the first embodiment or the like, if necessary.

When the curing agent 1201 is filling, at least the pattern surface of the template 1300 is retained at −25° C. in the method of forming the pattern by the imprint method according to this embodiment. The temperature of the template 1300 may be retained at −25° C. before the curing agent 1201 is contacted to the template 1300. The template 1300 may be set in the imprint equipment after controlling the temperature of the template 1300 or the temperature of the template 1300 is controlled by a temperature controlling portion installed in the imprint equipment.

After filling the curing agent 1201 is completed, the temperature of the template 1300 is up to the room temperature for example, 25° C., by using heating equipment 1202 such as a hotplate or the like configured near the pattern surface of the template as shown in FIG. 9B and FIG. 10B. In such a manner, the volume of the curing agent 1201 filled in the pattern 1301 is swollen by nearly 1%, so that the surface of the template 1300 is expanded against the pattern surface of the curing agent 1201 as shown in FIG. 9C and FIG. 10C.

Furthermore, the heating equipment 1202 is set near the template 1300 retained in the imprint equipment. On the other hand, the heating equipment 1202 may be set near the pattern surface of the template 1300 as shown in FIG. 9B and FIG. 10B, or may be set near the opposite surface to the pattern surface of the template. As shown in FIG. 9B and FIG. 10B, the heating equipment 1202 is used, however, the temperatures of the template 1300 and the curing agent 1201 may be increased by retaining at the room temperature in suitable time.

As shown in FIGS. 9D and 10D, the template 1300 and the substrate 1200 is gradually approached each other in retaining parallel fashion to contact the two surface, so that the template 1300 and the substrate 1200 are closely connected.

Subsequently, light is irradiated with the curing agent 1201 via the template 1300 to harden the curing agent 1201 as the same as the first embodiment or the like mentioned above. After sufficiently hardening, the template 1300 is demolded from the substrate 1200, so that a curing agent pattern is formed on the substrate 1200.

In such a manner, incompletely filling the curing agent 1201 into the pattern 1301 of the template 1300 can be prevented as the same as the previous embodiments mentioned above, so that defects in the curing agent pattern can be decreased according to the method of forming the pattern in this embodiment.

Furthermore, the curing agent filled in the substrate and the template easily contacted each other, so that the pattern transfer defect can be decreased without forming the curing agent layer at the substrate side according to the method of forming the pattern in this embodiment.

(Sixth Embodiment)

A method of forming the pattern according to a sixth embodiment is explained. The method of forming the pattern has a feature which has a water repellent addition agent in a curing agent in the methods by using imprinting according to the embodiment mentioned above or below. The methods include forming the patterns which selectively fill the curing agent into a concave portion of the template substrate. Explanation on other constitution and method are omitted as the same as the method of forming the pattern according to other embodiments.

A surface acting agent including fluorine or the like can be used as the water repellent addition agent doped in the curing agent. A kind of the surface acting agent may be selected from aliphatic acid series, linear alkylbenzene series, higher alcohol series, alpha olefin sulfonate series, normal paraffin series, alkylphenol series, amino acid series, betaine series, amine oxide series, quaternized ammonium salt series or the like.

When the curing agent is filled into the template pattern in contacting the curing agent to the template and relatively shifting by using the slit nozzle or the squeegee, or by using the rotationally coating, retrograde contacting angle of the curing agent can be enlarged to the template by using the curing agent including water repellent addition agent. For example, the retrograde contacting angle can be enlarged over 30°. In such a manner, the curing agent is hardly leaved on a portion of the template other than the pattern to further improve demolding characteristics in demolding the pattern, so that the defects can be decreased.

Moreover, the effect mentioned above can be obtained without the water repellent addition agent in a case of the retrograde contacting angle of the curing agent being larger, for example, over 30°.

(Seventh Embodiment)

A method of forming the pattern according to a seventh embodiment is explained as reference to FIG. 11. The method of forming the pattern has a feature which includes removing bubbles formed in the curing agent filled into the template pattern or generated at the interface between the curing agent and the template in the methods of forming the pattern by using the imprint method according to the embodiments mentioned above or below. The methods of forming the pattern includes that the curing agent is relatively shifted to the template substrate in continuing to contact to the template substrate. Explanation on other constitutions and methods are omitted as the same as the method of forming the patterns according to other embodiments.

FIG. 11 is an explanation view showing removing air bubbles in the method of forming the pattern according to the seventh embodiment. As shown in FIG. 11, a curing agent 1401 is relatively shifted to a pattern 1501 of a template 1500 in continuing to be contacted to the pattern 1501, so that a process atmosphere near the template 1500 is evacuated by a vacuum pump 1502 to remove the bubbles in the curing agent 1401. Especially, the bubbles are easily generated in the curing agent 1401 or at the interface between the curing agent 1401 and the template 1500, when the curing agent is filled in the pattern surface of the template 1500 facing upward, for example, the curing agent 1401 is filled by using the squeegee as the embodiment mentioned above. Accordingly, larger effect on removing bubbles can be obtained by pressure control of vacuum pump. Furthermore, removing the bubbles may be performed before coating, when the curing agent 1401 is coated on the surface outside of the pattern in the template 1500.

The vacuum pump 1502 is disposed in the imprint equipment, and the imprint equipment includes a reservoir 1503 surrounding the template 1500 and an atmosphere of the template 1500 which is an atmosphere near the curing agent 1401. The pressure in the reservoir 1503 can be controlled by evacuating a gas in the reservoir 1503 or introducing a gas into the reservoir 1503.

The pressure of the atmosphere near the curing agent 1401 provided in the reservoir 1503 is reduced by evacuating the gas in the reservoir 1503 using the vacuum pump 1502 to degas micro bubbles constituted with the processing atmosphere generated in the curing agent 1401 or at the interface between the curing agent 1401 and the template 1500. In such a manner, defects of the curing agent 1401 and pattern defects in the curing agent 1401 can be prevented.

Further, removing the bubbles according to the seventh embodiment can be applied to the method of forming the pattern in which the curing agent is relatively shifted to the template substrate in continuing to contact to the template substrate to fill the curing agent into the template pattern. Furthermore, the methods other than forming the pattern in which the curing agent is selectively provided to the template pattern according to the embodiments mentioned above or below are also included in this case.

(Eighth Embodiment)

A method of forming the pattern according to an eighth embodiment is explained as reference to FIG. 12. The method of forming the pattern has a feature which includes providing water-repellent property to a template. The method of forming the patterns includes selectively filling the curing agent into the concave pattern of the template substrate. Explanation on other constitutions and methods are omitted as the same as the method of forming the pattern according to other embodiments.

FIG. 12 is an explanation view showing providing water-repellent property to the template. As shown in FIG. 12, a template 1700 is retained in the chamber 1701 in providing water-repellent property in the method of forming the pattern according to this embodiment. Successively, hexamethyldisilazane (HMDS) 1702 bubbled by dry $N_2$ gas at room temperature is introduced into the chamber 1701, and the template 1700 is exposed in a HNDS atmosphere during 60 seconds to provide water-repellent property on a surface of the template 1700. The template may be performed water-repellent treatment before coating the curing agent on the template or before contacting the template substrate to the curing agent.

A contacting angle of a pure water is approximately 20° before water-repellent to the template 1700 and the contacting angle is increased 60° after water-repellent to the template 1700. Further, a water repellent treatment agent in method of forming the pattern according to the eighth embodiment is not restricted to HMDS, but a fluorine compound without silicon may be desirable.

When the curing agent relatively shifts by using the slit nozzle, the squeegee, or by using rotationally coating in continuing to contact the curing agent to the template to be filled into the template pattern, a retrograde contacting angle of the curing agent to the template 1700 can be enlarged by providing water-repellent to the template 1700. For example, the retrograde contacting angle can be enlarged over 30°. In such a manner, the curing agent is hardly leaved a portion of the template other than the pattern to further improve demolding characteristics in demolding the pattern, so that the defects can be decreased.

When the retrograde contacting angle of the curing agent to the template can be enlarged, for example, over 30° by suitably selecting the template material, the template may be used without water-repellent. The effect mentioned above can be obtained using such the template.

(Ninth Embodiment)

Figure 13:
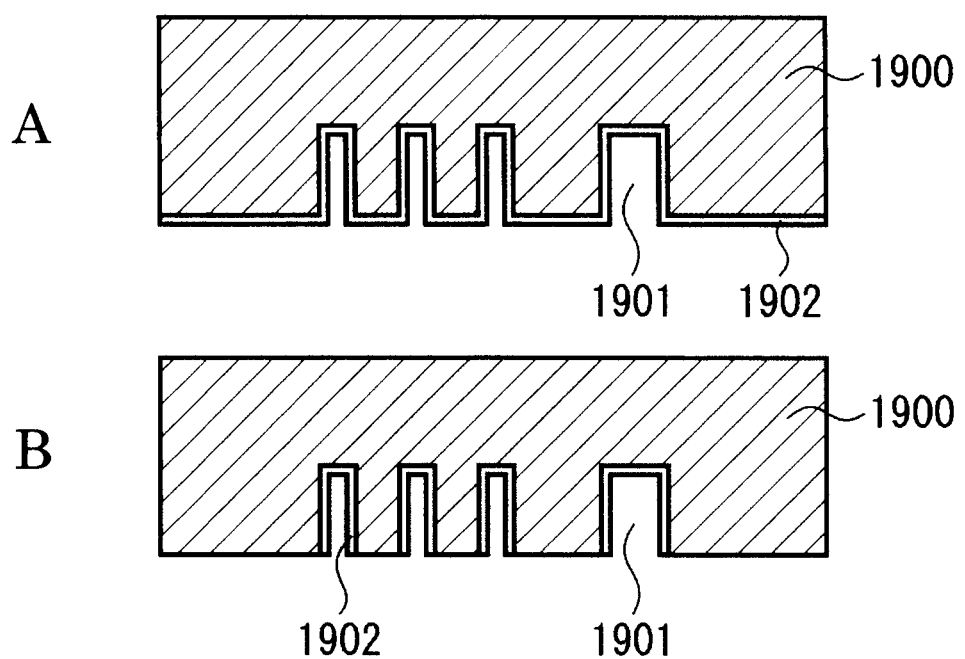

A method of forming the pattern according to a ninth embodiment is explained as reference to FIG. 13. The method of forming the pattern has a feature which includes providing hydrophilic property to a bottom surface and a side surface of a pattern in a template. The method of forming the pattern includes selectively filling the curing agent into a concave pattern of the template substrate. Explanation on other constitutions and methods are omitted as the same as the method of forming the pattern according to other embodiments.

FIG. 13A-13B are explanation views showing providing hydrophilic property on the template in a method of forming a pattern according to a ninth embodiment. As shown in FIG. 13, at least metal-included film 1902 with hydrophilic property, for example, a metal film, a metal oxide film, or a metal nitride film is formed on a surface in which a pattern 1901 of a template 1900 is formed in providing hydrophilic property. A film including at least one of Si, Ti and Al is desirable as the metal-included film 1902. Providing hydrophilic property can be performed before filling the curing agent in the pattern 1901.

Successively, as shown in FIG. 13B, the metal-included film 1902 of the template 1900 is polished to remove by using CMP. In such a manner, the surface of the template 1900 is exposed, and the metal-included film 1902 is selectively formed on the bottom surface and the side surface inside the pattern 1901 of the template 1900. Subsequently, a surface of the pattern 1901 of the template 1900 may be provided hydrophilic property as mentioned in the eighth embodiment.

Furthermore, using the methods as same as other embodiments, the curing agent pattern is formed by using the template 1900 formed the metal-included film with hydrophilic property 1902.

In the method of forming the pattern according to this embodiment, the contacting angle of the curing agent only in the template pattern can be decreased by providing hydrophilic property in the template pattern. Accordingly, capillary force is strengthened to improve filling characteristics. On the other hand, the surface of the template is relatively water repellent to the inner region of the template pattern, so that the curing agent is hardly leaved a portion other than the pattern. Therefore, the defects in transferring the pattern can be decreased.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalent are intended to cover such forms or modifications as would fall within the scope and spirit of the inventions.

What is claimed is:

1. A pattern forming method, comprising:
    selectively providing a curing agent to a pattern in a template, which includes:
        providing, through a slit nozzle, the curing agent;
        scanning the curing agent across the pattern in the template while contacting the curing agent to the pattern in the template, the curing agent selectively filling the pattern in the template by capillarity; and
        exhausting residual curing agent from the slit nozzle while retaining the curing agent in the pattern;
    contacting the template provided with the curing agent to a substrate;
    irradiating the curing agent with light to harden the curing agent where the template is contacted to the substrate;
    demolding the template from the substrate to form a curing agent pattern on the substrate; and
    etching the substrate using the pattern of the curing agent.

2. The method of claim 1, wherein selectively providing the curing agent to the pattern in the template includes relatively shifting the curing agent to the template in continuing to contact the curing agent to the template.

3. The method of claim 2, wherein
    a retrograde contacting angle of the curing agent to the template is over 30° in relatively shifting the curing agent to the template in continuing to contact the curing agent to the template.

4. The method of claim 1, wherein
    the curing agent includes a water repellent addition agent.

5. The method of claim 4,
    wherein the water repellent addition agent is a surface acting agent including fluorine.

6. The method of claim 1, further comprising:
    providing water repellent property to a pattern surface of the template before selectively providing the curing agent to the pattern in the template.

7. The method of claim 6, wherein
    the surface of the template is exposed to a hexamethyldisilazane atmosphere in providing water repellent property.

8. The method of claim 1, further comprising:
    providing hydrophilic property to the pattern surface of the template before selectively providing the curing agent to the pattern in the template.

9. The method of claim 8, wherein
    forming a film including a metal and having hydrophilic property on the pattern surface, the film being at least one of a metal film, a metal oxide film, and a metal nitride film.

10. The method of claim 1, further comprising:
    removing the curing agent left outside of the pattern in the template between selectively providing the curing agent to the pattern in the template and contacting the template provided the curing agent to the substrate.

11. The method of claim 1, further comprising:
    providing a photo curing agent on the surface outside the pattern in the template or the surface of the substrate, the photo curing agent being hardened by photo-radiation, before contacting the template to the substrate.

12. The method of claim 1, further comprising:
increasing a temperature of the template between selectively providing the curing agent to the pattern in the template and contacting the template to the substrate.

13. The method of claim 12, wherein the temperature is set to be 25° C.

14. The method of claim 1, further comprising:
reducing a pressure of an atmosphere near the curing agent between selectively providing the curing agent to the pattern in the template, and contacting the template to the substrate.

15. The method of claim 1, wherein
the pattern surface of the template faces upward in selectively providing the curing agent to the pattern in the template.

16. The method of claim 1, wherein
the pattern surface of the template faces downward in selectively providing the curing agent to the pattern in the template.

* * * * *